US012665016B2

(12) United States Patent
Ayyapureddi

(10) Patent No.: US 12,665,016 B2
(45) Date of Patent: Jun. 23, 2026

(54) DETECTION AND MITIGATION OF ATTACKS ON ROW HAMMER MITIGATION CIRCUITS

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 18/679,393

(22) Filed: May 30, 2024

(65) Prior Publication Data

US 2024/0428846 A1 Dec. 26, 2024

Related U.S. Application Data

(60) Provisional application No. 63/523,010, filed on Jun. 23, 2023.

(51) Int. Cl.
G11C 11/4078 (2006.01)
G11C 11/406 (2006.01)

(52) U.S. Cl.
CPC .... G11C 11/4078 (2013.01); G11C 11/40615 (2013.01); G11C 11/40622 (2013.01)

(58) Field of Classification Search
CPC ..................... G11C 11/4078; G11C 11/40615
See application file for complete search history.

(56) References Cited

U.S. PATENT DOCUMENTS

| | | | | |
|---|---|---|---|---|
| 11,204,832 B2 * | 12/2021 | Schat | .................. | G06F 11/3037 |
| 2023/0044186 A1 * | 2/2023 | You | ..................... | G11C 11/4093 |
| 2023/0205872 A1 * | 6/2023 | Kotra | .................... | G06F 21/554 726/23 |
| 2023/0395120 A1 * | 12/2023 | Ayyapureddi | .... | G11C 11/40622 |

* cited by examiner

*Primary Examiner* — Hoai V Ho
*Assistant Examiner* — Anthony Thinh Tang
(74) *Attorney, Agent, or Firm* — Dorsey & Whitney LLP

(57) ABSTRACT

Methods, apparatuses, and systems related to detecting and mitigating waterfall attacks are described. A memory device may include a waterfall attack mitigation circuit that is configured to detect, based on the ratio of read commands to write command received by the memory device, whether the memory device is the target of a waterfall attack. Upon detecting that the memory device is the target of a waterfall attack, the waterfall attack mitigation circuit can initiate certain mitigation actions, such as adjusting a threshold used to perform row hammer-related refreshes.

20 Claims, 5 Drawing Sheets

DETECTION AND MITIGATION OF ATTACKS ON ROW HAMMER MITIGATION CIRCUITS

CROSS-REFERENCE TO RELATED APPLICATION(S)

The present application claims priority to U.S. Provisional Patent Application No. 63/523,010, filed Jun. 23, 2023, the disclosure of which is incorporated herein by reference in its entirety.

TECHNICAL FIELD

The present disclosure is related to devices, and in particular semiconductor memory devices that detect and mitigate attacks on row hammer mitigation operations.

BACKGROUND

An apparatus (e.g., a processor, a memory system, and/or other electronic apparatus) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but rather are for explanation and understanding only.

DETAILED DESCRIPTION

Figure 1:
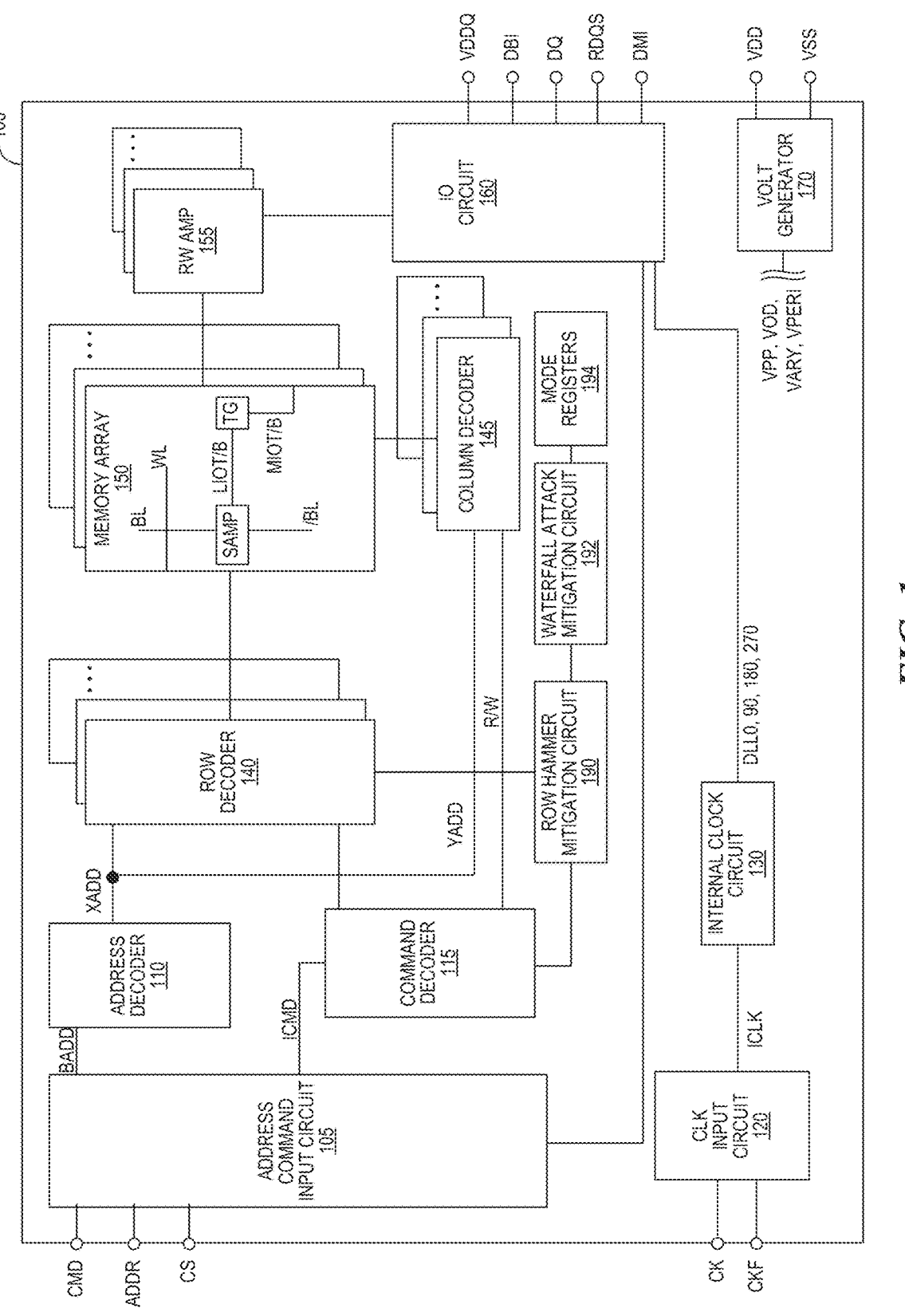
FIG. 1 is a block diagram schematically illustrating a memory device, in accordance with embodiments of the present technology.

High data reliability, high speed of memory access, and reduced chip size are features that are demanded from semiconductor memory. Some semiconductor memory devices, such as DRAM, store information as charge accumulated in cell capacitors that can be prone to leakage, and which therefore require periodic refresh operations to prevent the information from being lost. In addition to charge leakage, the information may be lost or degraded by bit errors caused by disturb mechanisms such as row hammer (e.g., repeated access of the same storage location or row within a threshold duration). Row hammer affects memory cells coupled to a non-selected word line adjacent to a selected word line that is repeatedly driven to an active level in a short time. The activity on the selected word line can cause the charge in the cells of the adjacent non-selected word line to vary, putting the information stored therein at risk, unless a refresh operation is executed to refresh the charge in the memory cells. As described in greater detail below, the technology disclosed herein relates to an apparatus, such as for memory systems, a system with memory devices, related methods, etc., for mitigating a class of attacks, referred to herein as waterfall attacks, that exploit row hammer effects.

In some memory devices, auto-refresh (AREF) commands indicating refresh operations are periodically issued from a control device such as a host or a controller operably coupled to the memory device. The AREF commands are provided from the control device at a frequency such that all the word lines will be refreshed once in a refresh cycle. However since the refresh addresses according to the AREF commands are determined by a refresh counter provided in DRAM, refresh operations responsive to the AREF commands may not prevent bit errors due to row hammer effects. Thus memory devices may include additional capabilities to address row hammer effects.

One approach to addressing row hammer effects involves providing a memory device with circuitry to redirect or steal a portion of the available refresh opportunities (e.g., the regularly scheduled refresh commands received from a host device) to specific victim rows where hammer activity has been detected (e.g., adjacent to a row where a large number of activation commands have been executed). For example, a row hammer mitigation circuit may count the number of times a row has been activated since a prior refresh of the adjacent victim rows. If the row activation count exceeds a threshold number, the row hammer mitigation circuit can initiate refreshes of the adjacent victim rows to address row hammer effects on those rows. For example, the row hammer mitigation circuit may add the row addresses of victim rows to a queue for refresh operations (otherwise referred to as a mitigation queue) so that the victim rows are refreshed.

In conventional memory devices, the threshold used to determine whether to refresh victim rows may be fixed and/or statically configured (e.g., based on memory device characteristics and the sensitivity of adjacent victim rows on row hammer effects). As a result, the memory devices and row hammer mitigation circuits may have a deterministic behavior, in which refresh operations are predictably generated for victim rows after a sufficient number of activations of an adjacent row. Furthermore, with the continual reduction in the geometries of memory arrays, and the corresponding increase in sensitivity to row hammer effects, the threshold number of adjacent-row activate commands that can be allowed to occur before a victim row is refreshed continues to decrease. These factors can enable a hostile actor to exploit row hammer effects, and the deterministic operations of row hammer mitigation circuits, to intentionally overwhelm memory devices with targeted row hammer activity to detrimental effect (e.g., degradation of data in a memory array).

In one such attack, generally referred to as a waterfall attack, multiple victim rows in an array are targeted by row hammer activity (e.g., by activate commands directed to one or more rows adjacent to the victim rows) to bring the count of adjacent-row activations close to, but still below, the threshold number that would trigger a targeted refresh of the victim rows. Once a sufficiently large number of such victim rows have been so primed, the attack involves targeted activations of the adjacent rows, thereby pushing a large number of victim rows past the threshold number in short order. In a conventional memory device, the memory device so attacked will respond by adding all of the victim rows to a queue (e.g., the mitigation queue) for refresh operations. By doing so, any of several undesirable results may occur. For example, if the number of victim row addresses to be added to the mitigation queue exceeds the capacity of the mitigation queue, the memory device may omit adding victim row addresses to the mitigation queue once queue capacity is reached. In such a scenario, the victim rows omitted from the mitigation queue may experience a change in value (e.g., bit flips in the data can occur), resulting in a memory device error. As a further example of what may occur when the number of victim row addresses to be added to the mitigation queue exceeds the capacity of the mitigation queue, the memory device may stall operations until a sufficient number of entries from the mitigation queue have been drained. This can result in a performance loss and/or denial-of-service attack. As a still further example, even if the mitigation queue has the capacity for all of the victim rows to be added, in the time it takes to complete corresponding refresh operations on all victim row addresses in the mitigation queue additional activate commands may continue to hammer the same set of victim rows, such that their contents can be degraded before they have been refreshed (e.g., due to their position in the mitigation queue).

Furthermore, it has been observed that row hammer attacks and waterfall attacks typically use a greater number of reads than writes to activate rows in the memory device. Row hammer and waterfall attack patterns favor the use of reads over writes because a greater number of read commands can be executed (and rows activated) within a given period of time. For example, the row cycle time (tRC), which characterizes the minimum time interval between successive activate commands, is shorter for a read command than a write command. Because these attack patterns predominantly use read commands, thereby taking advantage of the shorter tRC value of reads as compared to writes, the ratio of read to writes received by the memory device during a waterfall attack typically exhibit an imbalance not seen under normal workloads. It would therefore be advantageous to detect when the ratio of reads to writes indicates a possible waterfall attack, and respond appropriately.

Accordingly, embodiments of the present technology are directed to memory devices, systems including memory devices, and methods of operating memory devices, in which waterfall attacks are detected and mitigated based on the ratio of reads and writes. In contrast to conventional devices, the apparatus described herein includes a waterfall attack mitigation mechanism. The waterfall attack mitigation mechanism can include one or more read counters, and one or more write counters, that are updated based on the read commands and write commands received by the memory device. If the waterfall attack mitigation mechanism detects that the ratio of received read commands to received write commands (as indicated by the read counters and write counters, respectively) exceeds an expected ratio, the waterfall attack mitigation mechanism may determine that the memory device is the target of a waterfall attack. As described herein, in some embodiments the expected ratio of reads to writes can be based on information from the operating system (OS), system basic input/output system (BIOS), or other system component. In some embodiments, the OS and/or BIOS can configure one or mode registers of the memory device, used by the waterfall attack detection mechanism, with the expected ratio of reads to writes. For example, an OS running on the system can configure an expected ratio mode register based on an analysis of current and/or past software workloads executing on the system. In some embodiments the expected ratio of reads to writes can be a fixed and/or configurable parameter that is specified (e.g., as part of initial system configuration).

If the waterfall attack mitigation mechanism determines that the memory device is being targeted by a waterfall attack, the waterfall attack mitigation mechanism can initiate one or more mitigation actions. Mitigation actions can include, for example, stalling the memory device, reporting the waterfall attack to a system component (e.g., the host and/or controller operably coupled to the memory device), and/or changing the configuration of the row hammer mitigation circuit within the memory device (e.g., lowering the threshold used to determine whether to refresh victim rows). As such, the apparatus can dynamically respond (e.g., adjust threshold parameters used by row hammer mitigation circuits) when targeted by waterfall attacks.

Example Environment

FIG. 1 is a block diagram of an apparatus 100 (e.g., a semiconductor die assembly, including a three-dimensional integration (3DI) device or a die-stacked package) in accordance with an embodiment of the present technology. For example, the apparatus 100 can include a DRAM or a portion thereof that includes one or more dies/chips.

The apparatus 100 may include an array of memory cells, such as memory array 150. The memory array 150 may include a plurality of banks (e.g., banks 0-15), and each bank may include a plurality of word lines (WL), a plurality of bit lines (BL), and a plurality of memory cells arranged at intersections of the word-lines and the bit lines. Memory cells can include any one of a number of different memory media types, including capacitive, magnetoresistive, ferroelectric, phase change, or the like. The selection of a word-line WL may be performed by a row decoder 140, and the selection of a bit line BL may be performed by a column decoder 145. Sense amplifiers (SAMP) may be provided for corresponding bit lines BL and connected to at least one respective local input/output (IO) line pair (LIOT/B), which may in turn be coupled to at least a respective one main IO line pair (MIOT/B), via transfer gates (TG), which can function as switches. The sense amplifiers and transfer gates may be operated based on control signals from decoder circuitry, which may include the command decoder 115, the row decoders 140, the column decoders 145, any control circuitry of the memory array 150, or any combination thereof. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, and power supply terminals VDD, VSS, and VDDQ.

The command terminals and address terminals may be supplied with an address signal and a bank address signal (not shown in FIG. 1) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller and/or a chipset. The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded, and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word-line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register. The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like, based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VSS in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as timing signals for determining output timing of read data and/or input timing of write data. The IO clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The apparatus 100 can be connected to any one of a number of electronic devices capable of utilizing memory for the temporary or persistent storage of information, or a component thereof. For example, a host device of apparatus 100 may be a computing device, such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100; although in other embodiments, the host device may be indirectly connected to a memory device (e.g., over a networked connection or through intermediary devices).

The apparatus 100 can include circuits implementing mechanisms to detect and mitigate attacks on the apparatus, such as row hammer mitigation circuit 190 and/or waterfall attack mitigation circuit 192. The apparatus can additionally include one or mode registers 194, which can be programmed with data to be used by the row hammer mitigation circuit 190 and/or waterfall attack mitigation circuit 192.

The row hammer mitigation circuit 190 can be configured to determine when the apparatus 100 is the target of a row hammer attack, by determining that a victim row has been subject to a very high number of disturb effects caused by adjacent-row activate commands since the last refresh operation at the victim row. In some embodiments the row hammer mitigation circuit 190 maintains a count, for each row in memory array 150, of activation commands targeting that row since its last refresh operation (e.g., from which can be determined the amount of row hammer disturb effects imparted to adjacent rows). In some embodiments the row hammer mitigation circuit 190 maintains a count, for each row in memory array 150, of activation commands directed to neighboring rows (e.g., immediately adjacent rows and/or rows within a predetermined physical distance from the tracked row) since the last time the tracked row was refreshed. Based on these maintained counts, the row hammer mitigation circuit 190 can determine when a row should be refreshed to mitigate row hammer effects. To do so, the row hammer mitigation circuit 190 can monitor the maintained counts, determine if the counts of any rows exceed a row hammer mitigation threshold, and initiate refresh operations for rows whose counts exceeds the threshold (e.g., add the rows' addresses to a mitigation queue).

The row hammer mitigation threshold may be configurable based on characteristics of the apparatus 100. For example, if a row in the memory array 150 would be likely to experience one or more bits flips if 100,000 activations targeting neighboring rows occurred before the row was refreshed, the row hammer mitigation threshold could be configured to 50,000 activations (e.g., once a row's neighbors are activated more than 50,000 times before the row was refreshed, the row hammer mitigation circuit 190 adds the row to the mitigation queue). Furthermore, the row hammer mitigation threshold can be changed during operation of the apparatus 100. For example, and as described further herein, the waterfall attack mitigation circuit 192 can change the row hammer mitigation threshold in response to detecting a waterfall attack. The row hammer mitigation threshold can be maintained in a mode register (e.g., one of mode registers 194), and modified by overwriting the values in the mode register with different values, depending upon the desired sensitivity to attack, various operating requirements of the memory device, and/or a detected waterfall attack.

The waterfall attack mitigation circuit 192 can be configured to detect and mitigate waterfall attacks (e.g., attacks intended to exploit row hammer mitigation mechanism, such as those implemented by a row hammer mitigation circuit 190) based on the ratio of observed read and write commands. The waterfall attack mitigation circuit 192 includes one or more read counters and one or more write counters. In some embodiments, the waterfall attack mitigation circuit 192 includes one read counter and one write counter corresponding to the memory array 150. In some embodiments the waterfall attack mitigation circuit 192 includes multiple read counters and multiple write counters, each of which corresponds to a subset of the memory array 150 (e.g., one read counter and one write counter for each bank of the memory array 150). When the waterfall attack mitigation circuit 192 detects a read or write command for the memory array 150, it increments the corresponding counters (e.g., increments read counters when it detects read commands, and increments write counters when it detects write commands). For example, in embodiments of the apparatus 100 in which the waterfall attack mitigation circuit 192 maintains read and write counters for each bank of the memory array 150, the waterfall attack mitigation circuit 192 increments the counter corresponding to the bank in which the target address of the read or write command is located. As a further example, in embodiments of the apparatus 100 in which the waterfall attack mitigation circuit 192 maintains a single read counter and a single write counter for the entire memory array 150, the waterfall attack mitigation circuit 192 updates the appropriate counter (depending on whether it detects a read or a write) for all addresses found in the memory array 150. The waterfall attack mitigation circuit 192 can determine the type of command (e.g., read, write, or other), and the location corresponding to the address associated with the command (e.g., the bank) based on one or more control signals input to or generated by the command decoder 115, address decoder 110, and/or row decoders 140.

The waterfall attack mitigation circuit 192 evaluates the values in the read counters and the write counters to determine the ratio of read commands and write commands received by the apparatus 100. For example, if a read counter has the value x, and an associated write counter (e.g., associated with the same memory array 150 and/or subset of the memory array 150 with which the read counter is associated) has a value y, the waterfall attack mitigation circuit 192 can determine that the apparatus 100 has received an x: y ratio of read commands to write commands. In embodiments in which the waterfall attack mitigation circuit 192 includes multiple read and write counters (e.g., a read and write counter associated with each bank of the memory array 150), the waterfall attack mitigation circuit 192 can determine read-to-write ratios for each set of read and write counters (e.g., characterizing the ratio of read-to-write commands addressing each bank). As described further below, in some embodiments the waterfall attack mitigation circuit 192 will at certain times (e.g., periodically) reset the read counters and write counters to an initial value (e.g., zero), such that the ratio calculated based on the counters characterizes the read commands and write commands received by the apparatus 100 during a certain window of time (e.g., in between counter resets).

The waterfall attack mitigation circuit 192 evaluates the ratio of received read commands to received write commands (e.g., as calculated based on the one or more read counters and the one or more write counters), and determines whether the detected ratio exceeds an expected ratio of read commands to write commands. In some embodiments, the expected ratio is a static value specified by the implementation of the waterfall attack mitigation circuit 192 (e.g., based on logic gates designed to compare the detected ratio to a fixed value). In some embodiments, the expected ratio is a configurable value maintained in a mode register (e.g., one of mode registers 194), and modified by overwriting the values in the mode register with different values. For example, one of the mode registers 194 can be configured to an expected value during device initialization. The initial value for the expected ratio can, for example, be based on one or more device parameters, such as sensitivity to row hammer effects and waterfall attacks. In some embodiments, the expected ratio (e.g., maintained in one of the mode registers 194) can be modified during operation of the apparatus 100. For example, an OS and/or a BIOS, executing on the host operably coupled to the apparatus 100, can update the expected ratio value in a mode register 194 based on an analysis of workloads executing on the host. For example, typical workloads for a system can be characterized to obtain expected thresholds, which may be used as an expected ratio value. It has been observed that typical workloads generally exhibit a read-to-write ratio of 2:1 (i.e., the workload generally includes 2 read commands for every 1 write command), with an occasional period of 3:1 reads-to-writes. In some embodiments, the expected threshold is set to an initial value (e.g., during initialization of the apparatus 100 and/or based on the implementation of the waterfall attack mitigation circuit 192) greater than 3:1. For example, the expected threshold can have an initial value of 3.5:1, 4:1, and/or 10:1. However as discussed above, the expected threshold can change (e.g., increase and/or decrease) during operation, based on configuration of an expected value mode register by the OS and/or BIOS.

If the waterfall attack mitigation circuit 192 determines that a detected ratio of read-to-write commands (e.g., based on the one or more read counters and one or more write counters) exceeds the expected ratio of read-to-write commands (e.g., based on an expected ratio value in a mode register 194), the waterfall attack mitigation circuit 192 can initiate one or more mitigation actions. Mitigation actions can include, for example, stalling the apparatus 100, and/or reporting the waterfall attack to the host and/or controller operably coupled to the apparatus 100. The host can use the indication of a waterfall attack to, for example, shut down a corresponding software thread and/or deprioritize sending memory accesses to an impacted region of the apparatus 100 (e.g., a certain bank). As a further example, a mitigation action can include lowering the row hammer mitigation threshold used by the row hammer mitigation circuit 190, such as by updating a mode register 194 in which the row hammer mitigation threshold is stored. By lowering the row hammer mitigation threshold, the row hammer mitigation circuit 190 can more aggressively combat row hammer effects by more frequently refreshing victim rows. By more frequently refreshing victim rows, the apparatus 100 can mitigate row hammer effects before the impact caused by an ongoing waterfall attack could cause a bit flip in the memory array 150. As a still further example, a mitigation action can include flushing certain storage structures in the apparatus 100 or operably coupled component. For example, the system may flush the entries in a content-addressable memory (CAM) or other structure that holds the addresses of rows that need to be mitigated (e.g., refreshed). The CAM may be part of the memory device 100 or other memory system component coupled to the memory device, such as a compute express link (CXL) controller. In some embodiments the mitigation action can include mitigating (e.g., refreshing) the rows addressed by the CAM entries, and/or the rows neighbors, thereby draining corresponding entries from the CAM. In some embodiments the mitigation of rows and/or row neighbors, triggered by the mitigation action, can be performed at a greater priority than typical row hammer mitigation. For example the mitigation performed conventionally may be performed opportunistically (e.g., by stealing refresh cycles), and the mitigations triggered by the mitigation action performed outside of refresh cycles. In embodiments in which the waterfall attack mitigation circuit 192 determines multiple read-to-write ratios, each associated with a subset of the memory array 150 (e.g., each associated with a different bank), the waterfall attack mitigation circuit 192 can initiate mitigation actions if any one of the ratios exceeds the expected threshold.

The waterfall attack mitigation circuit 192 can be configured to initialize and/or reset the read counters and write counters to an initial value (e.g., zero). For example, the waterfall attack mitigation circuit 192 can reset the read and write counters to an initial value when the apparatus 100 is initialized. In some embodiments the waterfall attack mitigation circuit 192 resets the read and write counters periodically during operation. For example, the waterfall attack mitigation circuit 192 can reset the read and write counters every 1 ms, every 2 ms, etc. That is, the read and write counters can reflect a count of read and write commands received during a period of time of a certain duration (e.g., every 1 ms, every 2 ms, etc.). In some embodiments the waterfall attack mitigation circuit 192 resets the read and write counters upon the occurrence of certain events. For example, the waterfall attack mitigation circuit 192 can reset the read and write counters when it detects a waterfall attack and/or performs a mitigation action in response.

As described above, the apparatus 100 can include one or more mode registers 194 for storing various data (e.g., row hammer mitigation thresholds, expected ratios of read-to-write commands, device status information, etc.). The mode registers 194 may include read-only bits, read-write bits, write-only bits, or any combination thereof. In some embodiments, mode registers 194 may be arranged in byte-sized addressable portions, with each individually-addressable mode register containing 8 bits. The mode register bits may be written in response to mode register write (MRW) commands in which the data to be written is provided over a CA interface, and the mode register bits may be read in response to mode register read (MRR) commands in which the stored data output through the DQ data terminals. The mode registers 194 may also be read and written internally by various components of the apparatus 100, such as the row hammer mitigation circuit 190 and/or waterfall attack mitigation circuit 192 (e.g., populating read-only mode register bits with device status or configuration information, determining a status of a write-only mode register bit, determining a threshold, determining an expected ratio, etc.), but without exchanging data with a terminal of the memory device.

Although FIG. 1 illustrates an embodiment of the apparatus 100 in which the row hammer mitigation circuit 190, waterfall attack mitigation circuit 192, and mode registers 194 are illustrated as different components, in some embodiments, one or more of the aforementioned circuits and/or registers can be combined. For example, in some embodiments, the row hammer mitigation circuit 190 and waterfall attack mitigation circuit 192 are a single circuit that performs both row hammer and waterfall detection and mitigation functions.

Figure 2:
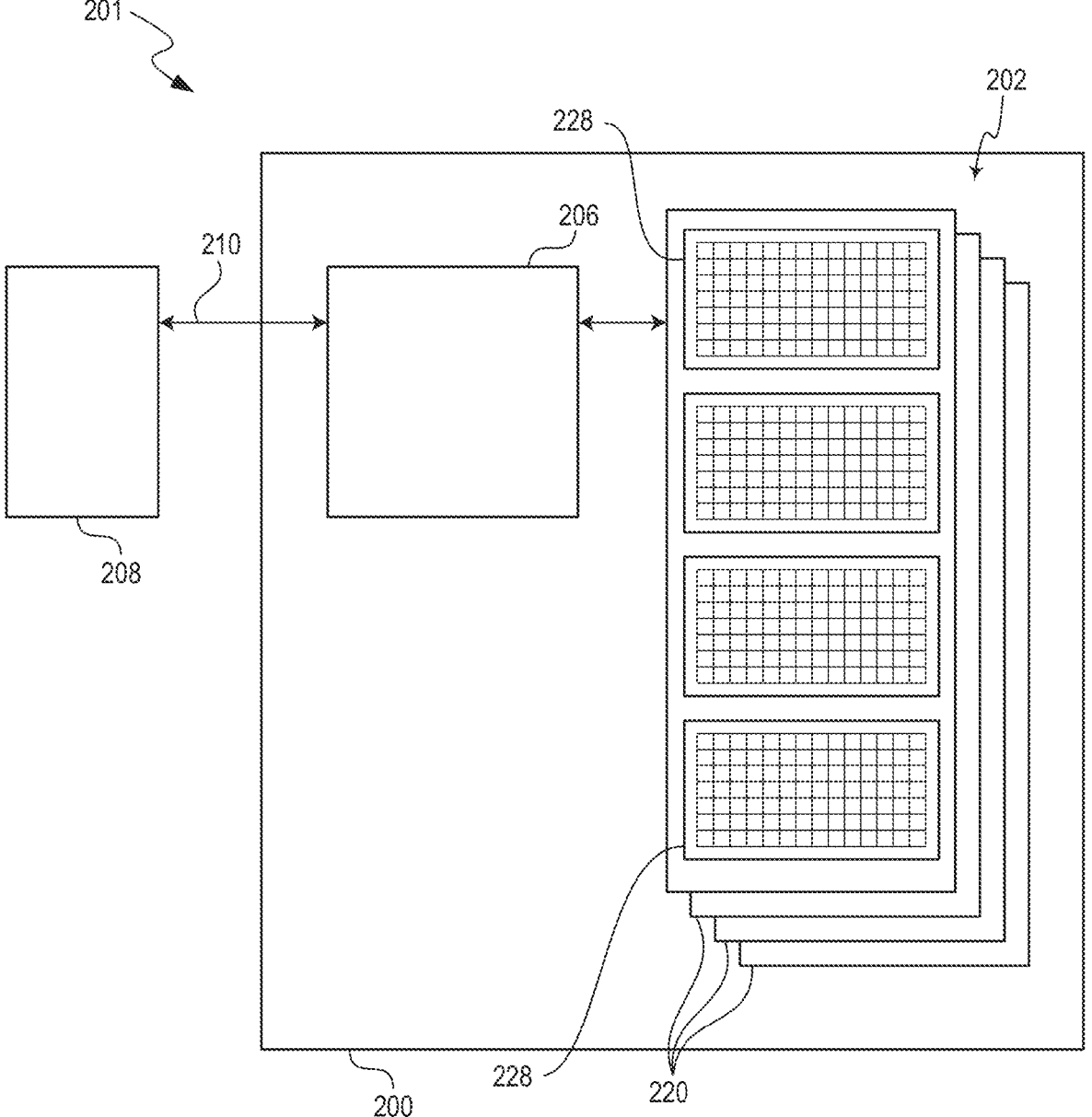
FIG. 2 is a block diagram of a system having a memory device configured in accordance with embodiments of the present technology.

FIG. 2 is a block diagram of a system 201 having a memory device 200 configured in accordance with embodiments of the present technology. The memory device 200 may be an example of or include aspects of the memory device described with reference to FIG. 1. As shown, the memory device 200 includes a main memory 202 (e.g., DRAM, NAND flash, NOR flash, FeRAM, phase change memory (PCM), etc.) and control circuitry 206 operably coupled to a host device 208 (e.g., an upstream central processor (CPU), a memory controller). The control circuitry 206 may include aspects of various components described with reference to FIGS. 1. For example, the control circuitry 206 may include aspects of the command/address input circuit 105, the address decoder 110, and the command decoder 115, among others.

The main memory 202 includes a plurality of memory units 220, which each include a plurality of memory cells. The memory units 220 can be individual memory dies, memory planes in a single memory die, a stack of memory dies vertically connected with through-silicon vias (TSVs), or the like. For example, in one embodiment, each of the memory units 220 can be formed from a semiconductor die and arranged with other memory unit dies in a single device package. In other embodiments, multiple memory units 220 can be co-located on a single die and/or distributed across multiple device packages. The memory units 220 may, in some embodiments, also be sub-divided into memory regions 228 (e.g., banks, ranks, channels, blocks, pages, etc.).

The memory cells can include, for example, floating gate, charge trap, phase change, capacitive, ferroelectric, magnetoresistive, and/or other suitable storage elements configured to store data persistently or semi-persistently. The main memory 202 and/or the individual memory units 220 can also include other circuit components, such as multiplexers, decoders, buffers, read/write drivers, address registers, data out/data in registers, etc., for accessing and/or programming (e.g., writing) the memory cells and other function, such as for processing information and/or communicating with the control circuitry 206 or the host device 208. Although shown in the illustrated embodiments with a certain number of memory cells, rows, columns, regions, and memory units for purposes of illustration, the number of memory cells, rows, columns, regions, and memory units can vary, and can, in other embodiments, be larger or smaller in scale than shown in the illustrated examples. For example, in some embodiments, the memory device 200 can include only one memory unit 220. Alternatively, the memory device 200 can include two, three, four, eight, ten, or more (e.g., 16, 32, 64, or more) memory units 220. Although the memory units 220 are shown in FIG. 2 as including four memory regions 228 each, in other embodiments, each memory unit 220 can include one, two, three, eight, or more (e.g., 16, 32, 64, 100, 128, 256, or more) memory regions.

In one embodiment, the control circuitry 206 can be provided on the same die as the main memory 202 (e.g., including command/address/clock input circuitry, decoders, voltage and timing generators, IO circuitry, etc.). In another embodiment, the control circuitry 206 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 206 can include a processor configured to execute instructions stored in memory to perform various processes, logic flows, and routines for controlling operation of the memory device 200, including managing the main memory 202 and handling communications between the memory device 200 and the host device 208. In some embodiments, the control circuitry 206 can include embedded memory with memory registers for storing (e.g., memory addresses, row counters, bank counters, memory pointers, fetched data, etc.) In another embodiment of the present technology, a memory device 200 may not include control circuitry, and may instead rely upon external control (e.g., provided by the host device 208, or by a processor or controller separate from the memory device 200).

The host device 208 can be any one of a number of electronic devices capable of utilizing memory for the temporary or persistent storage of information, or a component thereof. For example, the host device 208 may be a computing device, such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 208 may be a networking device (e.g., a switch, a router, etc.) or a recorder of digital images, audio and/or video, a vehicle, an appliance, a toy, or any one of a number of other products. In one embodiment, the host device 208 may be connected directly to memory device 200, although in other embodiments, the host device 208 may be indirectly connected to memory device 200 (e.g., over a networked connection or through intermediary devices).

In operation, the control circuitry 206 can directly write or otherwise program (e.g., erase) the various memory regions of the main memory 202. The control circuitry 206 communicates with the host device 208 over a host device bus or interface 210. In some embodiments, the host device 208 and the control circuitry 206 can communicate over a dedicated memory bus (e.g., a DRAM bus). In other embodiments, the host device 208 and the control circuitry 206 can communicate over a serial interface, such as a serial attached SCSI (SAS), a serial AT attachment (SATA) interface, a peripheral component interconnect express (PCIe), or other suitable interface (e.g., a parallel interface). The host device 208 can send various requests (in the form of, e.g., a packet or stream of packets) to the control circuitry 206. A request can include a command to read, write, erase, return information, and/or to perform a particular operation (e.g., a refresh operation, a TRIM operation, a precharge operation, an activate operation, a wear-leveling operation, a garbage collection operation, etc.).

Figure 3:
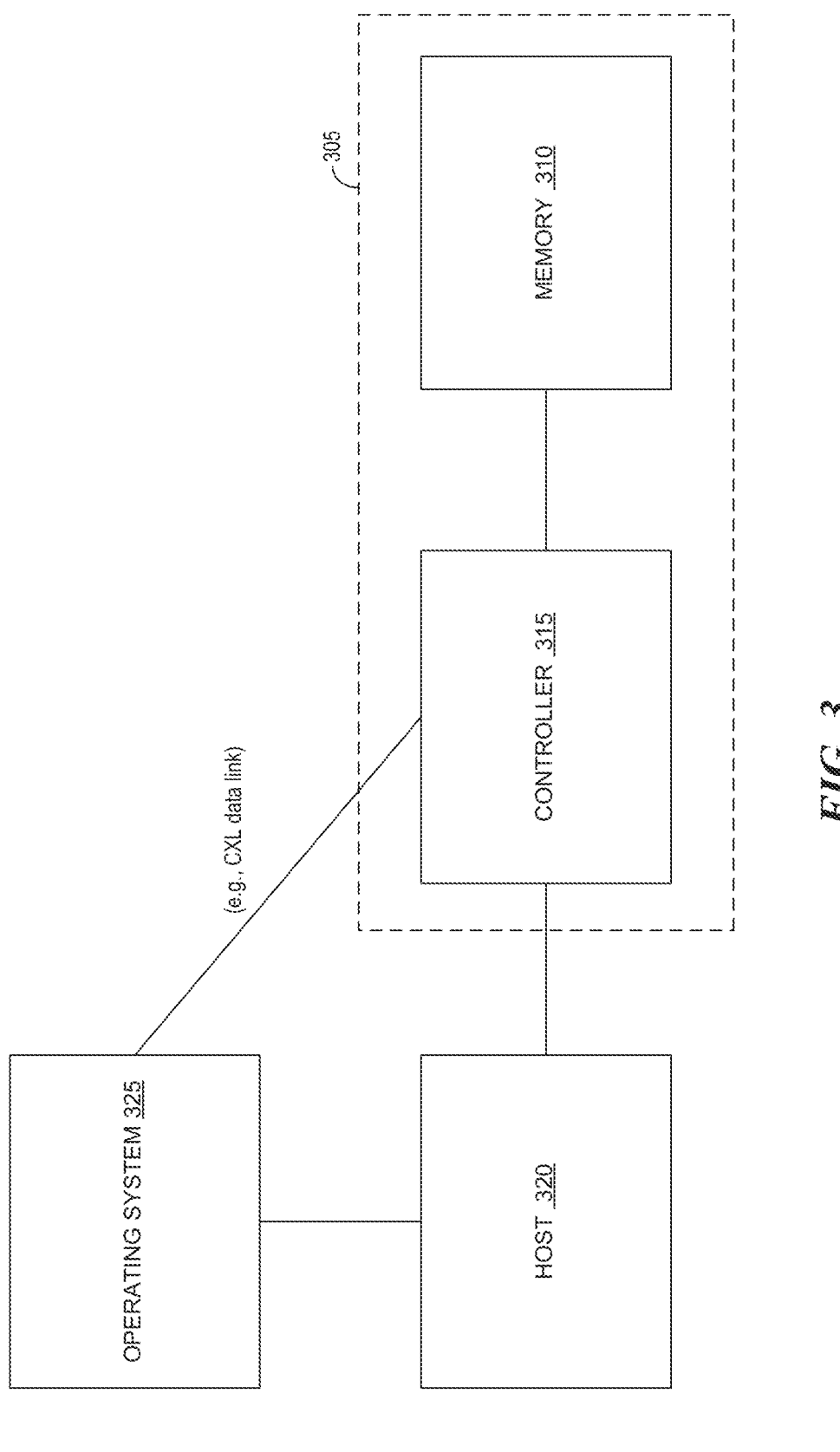
FIG. 3 is a block diagram of an example environment in which an apparatus may operate in accordance with an embodiment of the present technology.

FIG. 3 is a block diagram of an example environment 300 in which a compute express link (CXL) card 305 may operate in accordance with an embodiment of the present technology. The example environment 300 can correspond to a computing device or system. The CXL card 305 may include a memory 310 (e.g., the apparatus 100 of FIG. 1) and a controller 315. The memory 310 can include a volatile memory, a non-volatile memory, or a combination device/system. For example, the memory 310 can include a DRAM.

The memory 310 can be electrically coupled to the controller 315 (e.g., a memory controller, such as a CXL controller, a buffer, a repeater device, such as an RCD, etc.), a host 320 (e.g., a set of processors), and an operating system 325. Some example operating environments can include a computing system having a central processing unit (CPU) as the host 320 interacting with a memory controller to write data to and read data from a DRAM. The host 320 can function according to the operating system 325 and send operational communications (e.g., read/write commands, write data, addresses, etc.) to the memory controller. The CXL card 305 can also send read data back to a system controller (not shown) as the operational communications. The controller 315 can manage the flow of the data to or from the CXL card 305 according to the address and/or the operation. The memory 310 and controller 315 can be electrically coupled together to form the CXL card 305. The controller 315 can track the data entering the CXL card 305 and initiate mitigating steps.

The controller 315 and/or memory 310 can include aspects of the apparatus 100 illustrated in FIG. 1. For example, the controller 315 can have and maintain read counters and write counters, based on which it can determine the ratio of read commands to write commands received by the CXL card 305. As described herein, the controller 315 can compare the ratio of read commands to write commands (based on the counters) to an expected ratio, and detect waterfall attacks when the counter-based ratio exceeds the expected ratio (e.g., there are a greater number of reads-to-write than expected). When the controller 315 detects a waterfall attack, it can inform the host 320 or operating system 325 when the memory 310 (or a region therein) is undergoing a waterfall attack.

The operating system 325 can evaluate different operating conditions of the environment 300, and determine the expected read-to-write ratio during operations. In some embodiments the operating system 325 determines the expected read-to-write ratio based on a lookup table. In some embodiments, the lookup table includes expected read-to-write ratios of software operating on the host 320, typical workloads run on the host, etc. For example, the operating system 325 can evaluate characteristics of other software (not shown) operating on the host 320. The operating system 325 can configure the CXL card 305 based on the expected read-to-write ratio, through a main data bus or a sideband bus operatively coupled to the CXL card 305. For example, the operating system 325 can program a mode register (not shown) in the CXL card 305 when the expected ratio of read commands to write commands.

Flow for Waterfall Attack Detection and Mitigation

Figure 4:
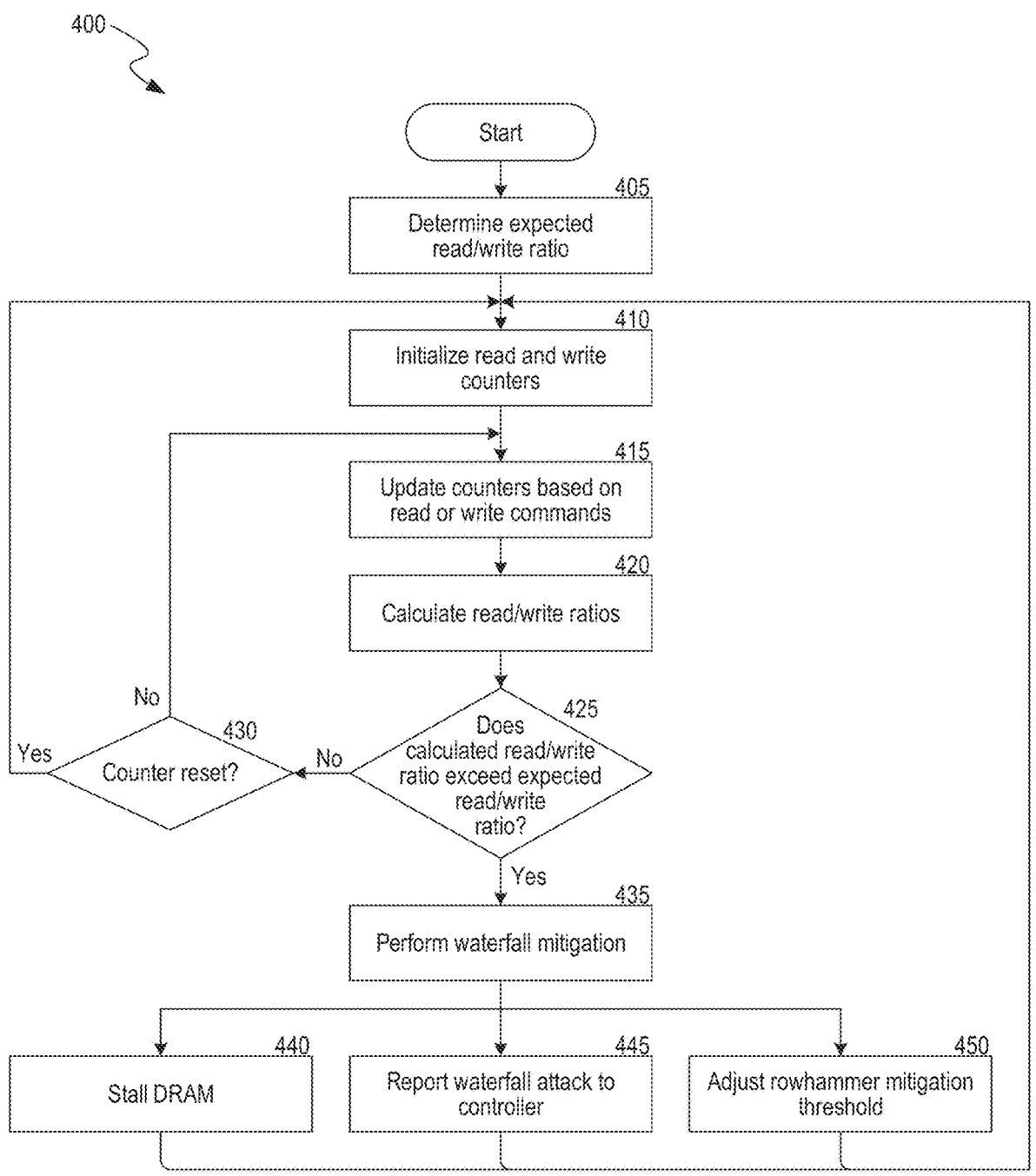
FIG. 4 is a flow diagram illustrating a process for mitigating attacks on row hammer mitigation circuits, in accordance with embodiments of the present technology.

FIG. 4 is a flow diagram illustrating a process 400 for mitigating attacks on row hammer mitigation circuits, in accordance with embodiments of the present technology. Aspects of the process 400 can be performed, for example, by the apparatus 100 of FIG. 1 (including row hammer mitigation circuit 190, waterfall attack mitigation circuit 192, and/or mode registers 194), the CXL card 305 of FIG. 3, or a combination thereof.

The process 400 begins at block 405, where the process determines an expected read-to-write ratio. As described herein, the expected read-to-write ratio characterizes the number of read commands and write commands, and the relative frequency of one over the other, expected to be executed in a workload. The expected read-to-write ratio can be obtained from a value in a mode register, where the mode register has been programmed and/or configured by an OS, BIOS, or other system component.

At block 410, the process 400 initializes one or more read counters and one or more write counters to an initial value (e.g., zero). In some embodiments there is one read counter and one write counter (associated with an entire memory array) to be initialized by the process 400. In some embodiments there are multiple read counters and multiple write counters (where an individual read counter and an individual write counter are associated with a subset of the memory array, such as a bank of the memory array), all of which are initialized by the process.

At block 415, the process 400 updates a read counter or a write counter corresponding to a received command (e.g., a command from a host issued to the memory array). That is, a read counter is updated when the process detects a read command, and a write counter is updates when the process detects a write command. The update can be an increment by 1 (i.e., increment, by 1, the current value in the counter to be updated). In embodiments with multiple read counters and multiple write counters, each associated with a subset of the memory array, the process 400 updates the counter corresponding to the memory array subset being read from or written to. For example, if read and write counters are associated with individual banks of the memory array (e.g., banks 0-15), then the process 400 updates the counter corresponding to the bank being read from or written to.

At block 420, the process 400 calculates read-to-write ratios of received read commands and write commands. The process 400 can calculate read-to-write ratios based on the read counters and write counters. For example, if a read counter has recorded 3,300 read commands and a corresponding write counter has recorded 1,100 write commands, the process 400 can calculate a 3:1 ratio of detected read commands to write commands. In embodiments with multiple read counters and multiple write counters (e.g., each pair of read counter and write counter corresponding to a subset of the memory array), the process 400 can calculate ratios for all pairs of read counters and write counters.

At decision block 425, the process 400 determines whether the calculate read-to-write ratios of received commands exceeds the expected read-to-write ratio. For example, if an expected read-to-write ratio is 3:1, and the process 400 has calculated a read-to-write ratio of 10:1 based on received commands, then the calculated read-to-write ratio exceeds the expected read-to-write ratio (e.g., there is a greater prevalence of detected read commands, relative to detected write commands, than expected). If the process 400 determines that the calculated read-to-write ratio does not exceed the expected read-to-write ration, then process continues to decision block 430. If the process 400 determines that the calculated read-to-write ratio exceeds the expected read-to-write ration, indicative of a waterfall attack, then process continues to block 435. In embodiments with more than one calculated read-to-write ratio, each corresponding to a subset of the memory array, the process 400 can continue to block 435 if any of the ratios exceeds the expected read-to-write ratio.

At decision block 430, the process 400 determines whether to reset the read counters and write counters. In some embodiments, the process 400 determines to reset the read and write counters after a threshold amount of time has elapsed since the last counter reset (e.g., every 1 ms or 2 ms). In some embodiments, the process 400 determines to reset the read and write counters upon the occurrence of certain events (e.g., when a waterfall attack is detected). If the process 400 determines to reset the read counters and write counters, then the process 400 returns to block 410 to reset the counters to an initial value (e.g., zero). If the process 400 determines not reset the reset counters and write counters, then the process 400 returns to block 415 to continue updating the read and write counters in response to detected read and write commands. In embodiments with multiple read counters and multiple write counters, the process 400 can make different determinations at decision block 430 for the different read and write counters. For example, a pair of read counter and write counter corresponding to one bank of the memory array may be ready to be reset (based on the time elapsed since the last reset), while another pair of read counter and write counter corresponding to another bank of the memory array may not be ready to be reset.

If at the decision block 425 the process 400 determined that a calculated read-to-write ratio exceeded the expected read-to-write ratio, which can be indicative of a waterfall attack, then at block 435 the process 400 can perform one or more mitigation actions in response. For example, the process 400 can stall the memory device (as illustrated by block 440). As an additional example, the process 400 can report the ongoing waterfall attack to the host to which the memory device is operatively coupled (as illustrated by block 445). As a further example, the process 400 can adjust parameters used by the memory device to mitigate row hammer effects. For example, the process 400 can lower the threshold used by a row hammer mitigation mechanism (e.g., the row hammer mitigation circuit 190 illustrated in FIG. 1) to determine when to refresh victim rows. The illustrated mitigation actions, as well as other mitigation actions, can be performed alone or in combination. The process 400 then returns to block 410 to reset the read counters and write counters.

While FIG. 4 illustrates an embodiment of the process 400 that evaluates all read counters and write counters, in some embodiments the process 400 evaluates a single pair of read counter and write counter, and the process 400 is performed (e.g., by the apparatus 100 of FIG. 1 and/or the CXL card 305 of FIG. 3) in parallel for each of the read counter and write counter pairs. For example, in an embodiment in which there are multiple read counter and write counter pairs, each associated with a subset of the memory array, the process 400 may be performed in parallel for each of the counter pairs. That is, for example, the process 400 can be performed to update counters, calculate a ratio, and perform mitigation actions in connection with read and write commands to a first bank of the memory array, and separately the process 400 can be performed to do the same in connection with read and write commands to a second bank of the memory array.

Figure 5:
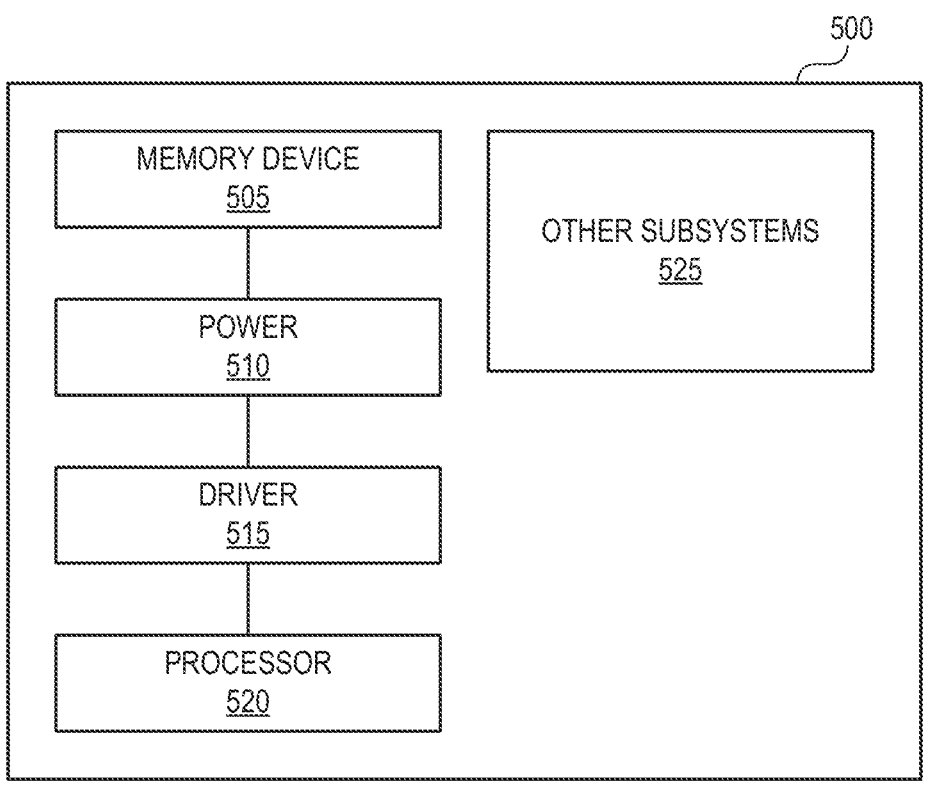
FIG. 5 is a schematic view of a system that includes an apparatus, in accordance with embodiments of the present technology.

FIG. 5 is a schematic view of a system 500 that includes an apparatus in accordance with embodiments of the present technology. Any one of the foregoing apparatuses (e.g., memory devices, CXL cards, etc.) described above with reference to FIGS. 1-4 can be incorporated into any of a myriad of larger and/or more complex systems, a representative example of which is system 500 shown schematically in FIG. 5. The system 500 can include a memory device 505, a power source 510, a driver 515, a processor 520, and/or other subsystems or components 525. The memory device 505 can include features generally similar to those of the apparatus described above with reference to FIGS. 1-4 and can therefore include various features for detecting and mitigation waterfall attack. The resulting system 500 can perform any of a wide variety of functions, such as memory storage, data processing, and/or other suitable functions. Accordingly, representative systems 500 can include, without limitation, hand-held devices (e.g., mobile phones, tablets, digital readers, and digital audio players), computers, vehicles, appliances and other products. Components of the system 500 may be housed in a single unit or distributed over multiple, interconnected units (e.g., through a communications network). The components of the system 500 can also include remote devices and any of a wide variety of computer readable media.

It should be noted that the methods described above describe possible implementations, and that the operations and the steps may be rearranged or otherwise modified and that other implementations are possible. Furthermore, embodiments from two or more of the methods may be combined.

Although in the foregoing example embodiments, memory modules and devices have been illustrated and described with respect to DRAM devices, embodiments of the present technology may have application to other memory technologies, including SRAM, SDRAM, NAND and/or NOR flash, PCM, magnetic RAM (MRAM), ferro-electric RAM (FeRAM), etc. Moreover, although memory modules have been illustrated and described as dual in-line memory modules (DIMMs) having nine memory devices, embodiments of the disclosure may include more or fewer memory devices, and/or involve other memory module or package formats (e.g., single in-line memory modules (SIMMs), small outline DIMMS (SODIMMs), single in-line pin packages (SIPPs), custom memory packages, etc.).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

I claim:

1. A memory device, comprising:
a memory array including a plurality of rows of memory cells;
a row hammer mitigation circuit configured to:
determine whether a first row of the plurality of rows has accumulated an activation count exceeding a row hammer mitigation threshold, and
initiate, in response to determining that the first row has accumulated an activation count exceeding the row hammer mitigation threshold, a row hammer mitigation action; and
a waterfall attack mitigation circuit configured to:
calculate a read-to-write ratio characterizing a plurality of commands received by the memory device,
determine whether the calculated read-to-write ratio exceeds an expected read-to-write ratio representative of a waterfall attack that exploits row hammer effects through numerous activations of rows to cause an error in the memory device, and
initiate, in response to determining that the calculated read-to-write ratio exceeds the expected read-to-write ratio, a waterfall mitigation action.

2. The memory device of claim 1, wherein an activation count characterizes an activation directed to a row adjacent to the first row.

3. The memory device of claim 1, wherein the row hammer mitigation action comprises refreshing a row adjacent to the first row.

4. The memory device of claim 1, wherein calculating the read-to-write ratio comprises:
maintaining a count of read commands received by the memory device;
maintaining a count of write commands received by the memory device;
detecting a command received by the memory device;
determining whether the received command is a read command or a write command;
updating, based on the determination of whether the received command is a read command or a write command, the count of read commands or the count of write commands; and
generating the read-to-write ratio based on the count of read commands and the count of write commands.

5. The memory device of claim 4, wherein calculating the read-to-write ratio further comprises resetting the count of read commands to 0, and resetting the count of write commands to 0, after a threshold time has elapsed.

6. The memory device of claim 5, wherein the threshold time is between 1 ms and 2 ms.

7. The memory device of claim 1, wherein the calculated read-to-write ratio is based on commands received by the memory device during a 1 ms period of time.

8. The memory device of claim 1, the memory device further comprising:
a mode register configured to maintain the expected read-to-write ratio.

9. The memory device of claim 8, wherein the expected read-to-write ratio in the mode register is programmed by a host operatively coupled to the memory device.

10. The memory device of claim 1, wherein:
the memory array comprises a plurality of memory banks, each memory bank comprising a subset of the plurality of rows of memory cells; and
the waterfall mitigation circuit is further configured to:
maintain a plurality of read counters and write counters, wherein each of a read counter and a write counter are associated with a memory bank;
detecting a command received by the memory device, the command associated with a memory banks;
updating the read counter or write counter associated with the memory bank that is associated with the received command; and
wherein the calculated read-to-write ratio is associated with a memory bank, and calculated based on the read counter and write counter associated with the memory bank.

11. The memory device of claim 1, wherein the waterfall mitigation action comprises stalling the memory device.

12. The memory device of claim 1, wherein the waterfall mitigation action comprises lowering the row hammer mitigation threshold.

13. The memory device of claim 1, wherein the memory array is a DRAM array.

14. A compute express link (CXL) card comprising:
a memory array; and
a controller configured to:
calculate a read-to-write ratio characterizing a plurality of commands received by the CXL card,
determine whether the calculated read-to-write ratio exceeds an expected read-to-write ratio representative of a waterfall attack that exploits row hammer effects through numerous activations of rows to cause an error in the memory device, and
initiate, in response to determining that the calculated read-to-write ratio exceeds the expected read-to-write ratio, a waterfall mitigation action.

15. The CXL card of claim 14, wherein the waterfall mitigation action comprises adjusting a row hammer mitigation threshold, based on which a subset of the memory array is refreshed.

16. The CXL card of claim 14, wherein calculating the read-to-write ratio comprises:
maintaining a count of read commands received by the CXL card;
maintaining a count of write commands received by the CXL card;
detecting a command received by the CXL card;
determining whether the received command is a read command or a write command;
updating, based on the determination of whether the received command is a read command or a write command, the count of read commands or the count of write commands; and generating the read-to-write ratio based on the count of read commands and the count of write commands.

17. The CXL card of claim 16, wherein calculating the read-to-write ratio further comprises resetting the count of read commands to 0, and resetting the count of write commands to 0, after a threshold time has elapsed.

18. The CXL card of claim 14, wherein the expected read-to-write ratio is configured by a host operatively coupled to the CXL card.

19. An apparatus comprising:

a memory array;

a row hammer mitigation circuit; and a waterfall attack mitigation circuit configured to:

determine, based on a plurality of commands addressing the memory array, a waterfall attack targeting the memory array, wherein the plurality of commands corresponds to a pattern associated with a waterfall attack that exploits row hammer effects through numerous activations of rows to cause an error in the memory device, and adjusting, based on the determination that a waterfall attack is targeting the memory array, a configuration of the row hammer mitigation circuit.

20. The apparatus of claim 19, wherein the configuration of the row hammer mitigation circuit comprises an activation threshold based on which a subset of memory array is refreshed.

\* \* \* \* \*